United States Patent
Ikegami

(10) Patent No.: US 9,817,384 B2
(45) Date of Patent: Nov. 14, 2017

(54) METHOD OF INSPECTING RAM OF PROGRAMMABLE LOGIC CONTROLLER, AND PROGRAMMABLE LOGIC CONTROLLER

(71) Applicant: JTEKT CORPORATION, Osaka-shi (JP)

(72) Inventor: Kenichi Ikegami, Inazawa (JP)

(73) Assignee: JTEKT CORPORATION, Osaka-shi (JP)

( * ) Notice: Subject to any disclaimer, the term of this patent is extended or adjusted under 35 U.S.C. 154(b) by 301 days.

(21) Appl. No.: 14/660,106

(22) Filed: Mar. 17, 2015

(65) Prior Publication Data

US 2015/0277417 A1 Oct. 1, 2015

(30) Foreign Application Priority Data

Mar. 25, 2014 (JP) ................................. 2014-061861

(51) Int. Cl.
*G11C 29/00* (2006.01)
*G05B 19/05* (2006.01)
*G11C 29/04* (2006.01)

(52) U.S. Cl.
CPC .. *G05B 19/058* (2013.01); *G05B 2219/14085* (2013.01); *G11C 2029/0409* (2013.01)

(58) Field of Classification Search
CPC ........ G05B 19/058; G05B 2219/14085; G11C 2029/0409
See application file for complete search history.

(56) References Cited

U.S. PATENT DOCUMENTS

| 4,541,090 A | 9/1985 | Shiragasawa |
| 5,377,148 A | 12/1994 | Rajsuman |

(Continued)

FOREIGN PATENT DOCUMENTS

| JP | H03-001400 A | 1/1991 |
| JP | 8-87429 | 4/1996 |
| JP | 2006-40122 | 2/2006 |

(Continued)

OTHER PUBLICATIONS

Extended European Search Report dated Aug. 19, 2015 in European Patent Application No. 15160240.6.

(Continued)

*Primary Examiner* — Guy Lamarre
(74) *Attorney, Agent, or Firm* — Oblon, McClelland, Maier & Neustadt, L.L.P.

(57) ABSTRACT

A method of inspecting a RAM of a programmable logic controller is provided that enables all unit storage regions in a RAM inspection region to be inspected in about several minutes and that meets a predetermined safety standard. The inspection method includes the steps of: (a) dividing a RAM inspection region, which is a region of the RAM to be inspected, into a plurality of blocks; and (b) by a control device, writing a predetermined value into unit storage regions in a combination of blocks obtained by combining two blocks extracted from the divided blocks and thereafter sequentially inspecting whether or not values read from the unit storage regions each coincide with the written value. Step (b) is executed for all combinations of two blocks extracted from the divided blocks.

10 Claims, 12 Drawing Sheets

(56) References Cited

U.S. PATENT DOCUMENTS

2007/0282457 A1* 12/2007 Araki ................ G05B 19/0428
700/1
2008/0021575 A1   1/2008 Araki et al.

FOREIGN PATENT DOCUMENTS

WO    WO 2006/011579 A1   2/2006
WO       2012/111135 A1   8/2012

OTHER PUBLICATIONS

Rex Sallade, Commanders Independent Thermal Viewer and Hull/Turret Electronics Unit—Built-in Test and Diagnostics: Two Different Approaches to Meeting the M1A2 Supportability Requirements, Institute of Electrical and Electronics Engineers: XP010036866, Sep. 24-26, 1991, pp. 3-14.
Office Action dated Sep. 26, 2017 in Japanese Application No. 2014-061861, along with an English translation.

* cited by examiner

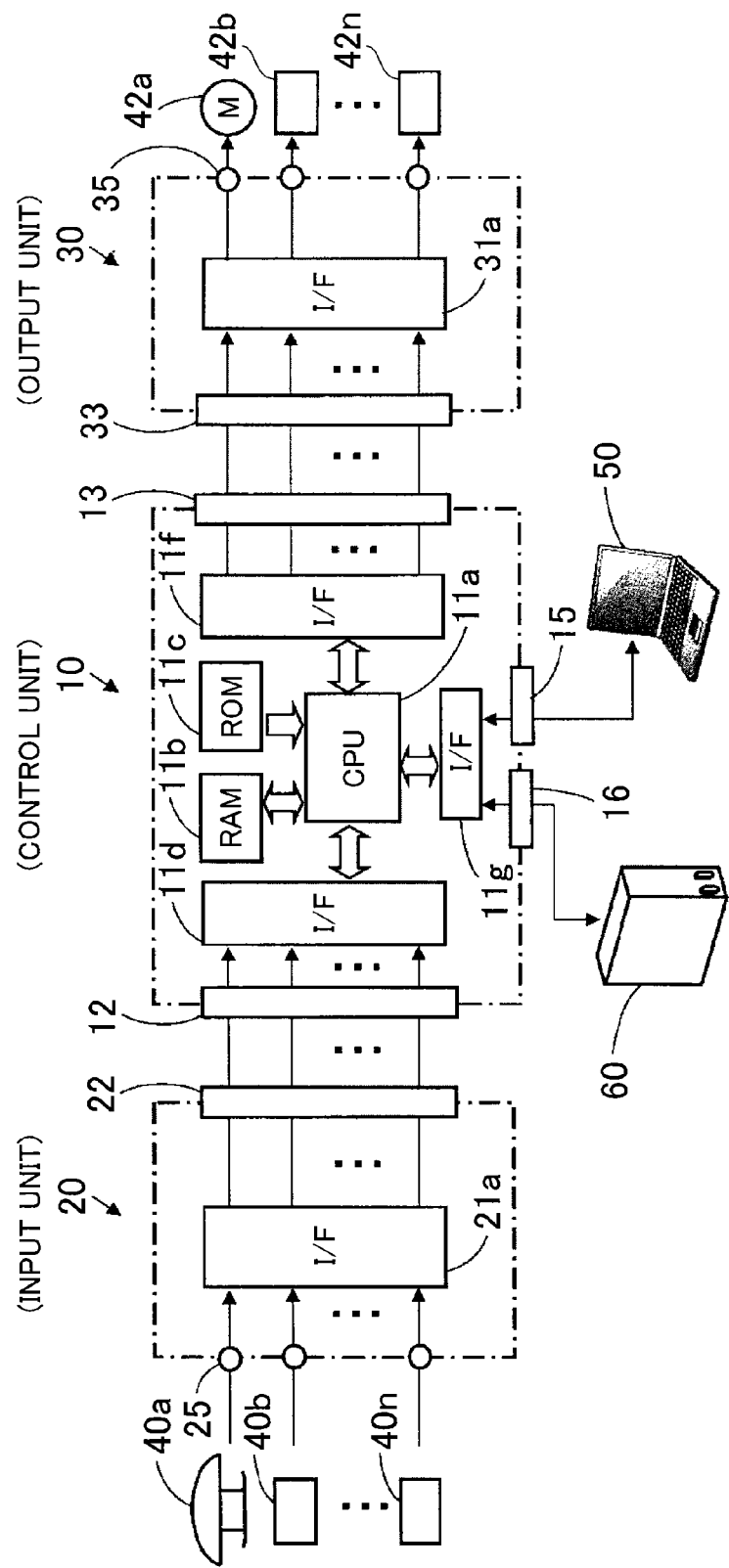

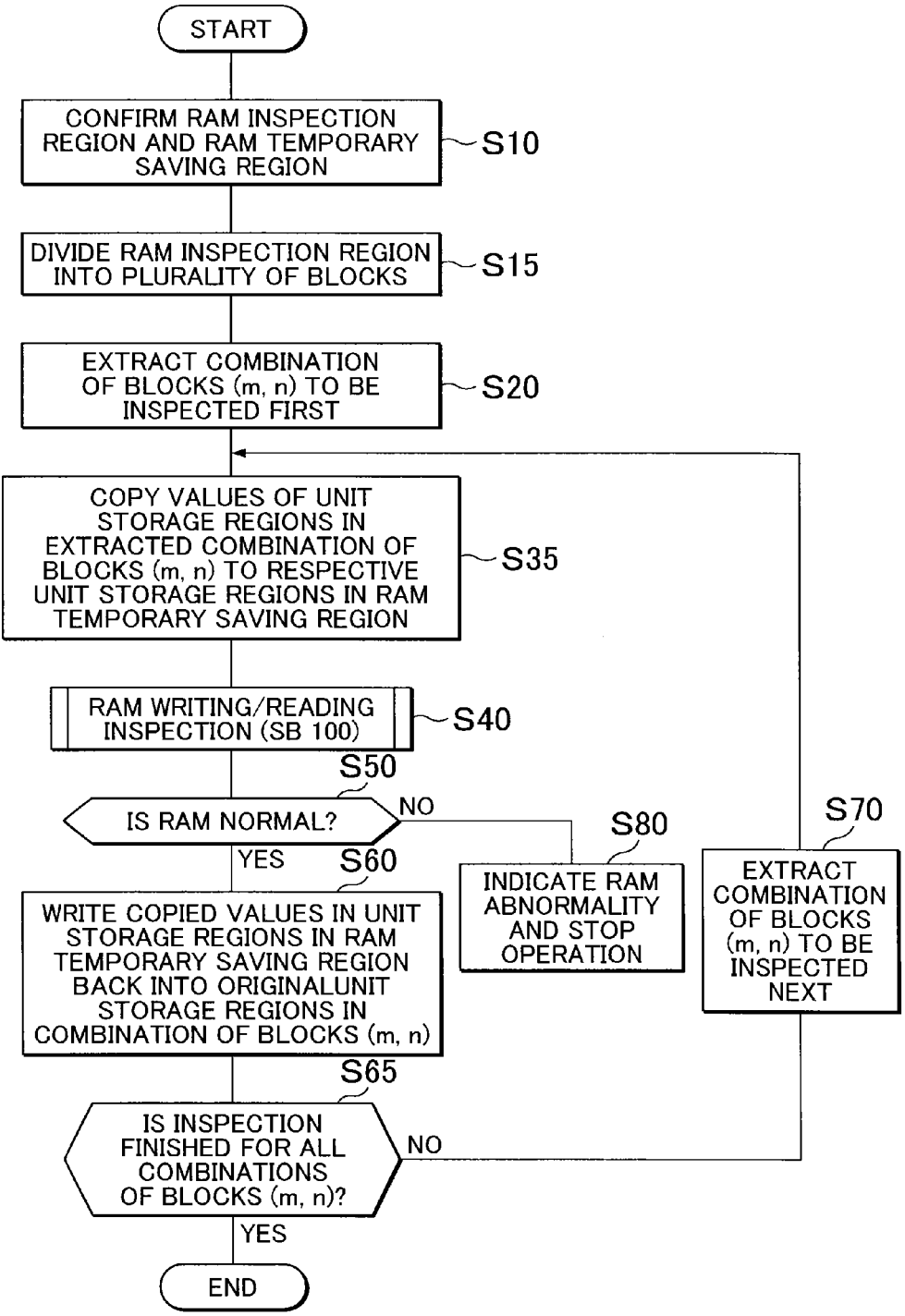

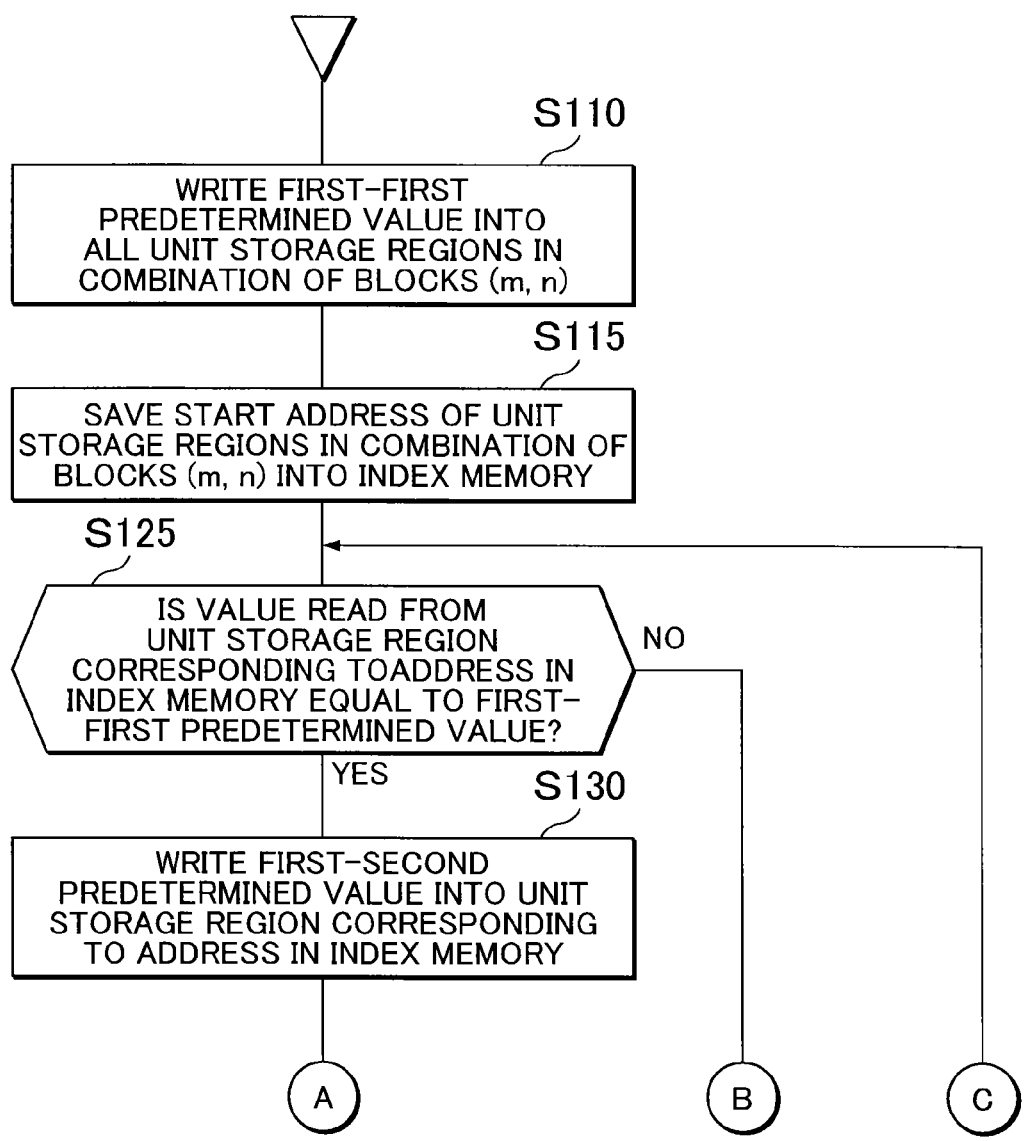

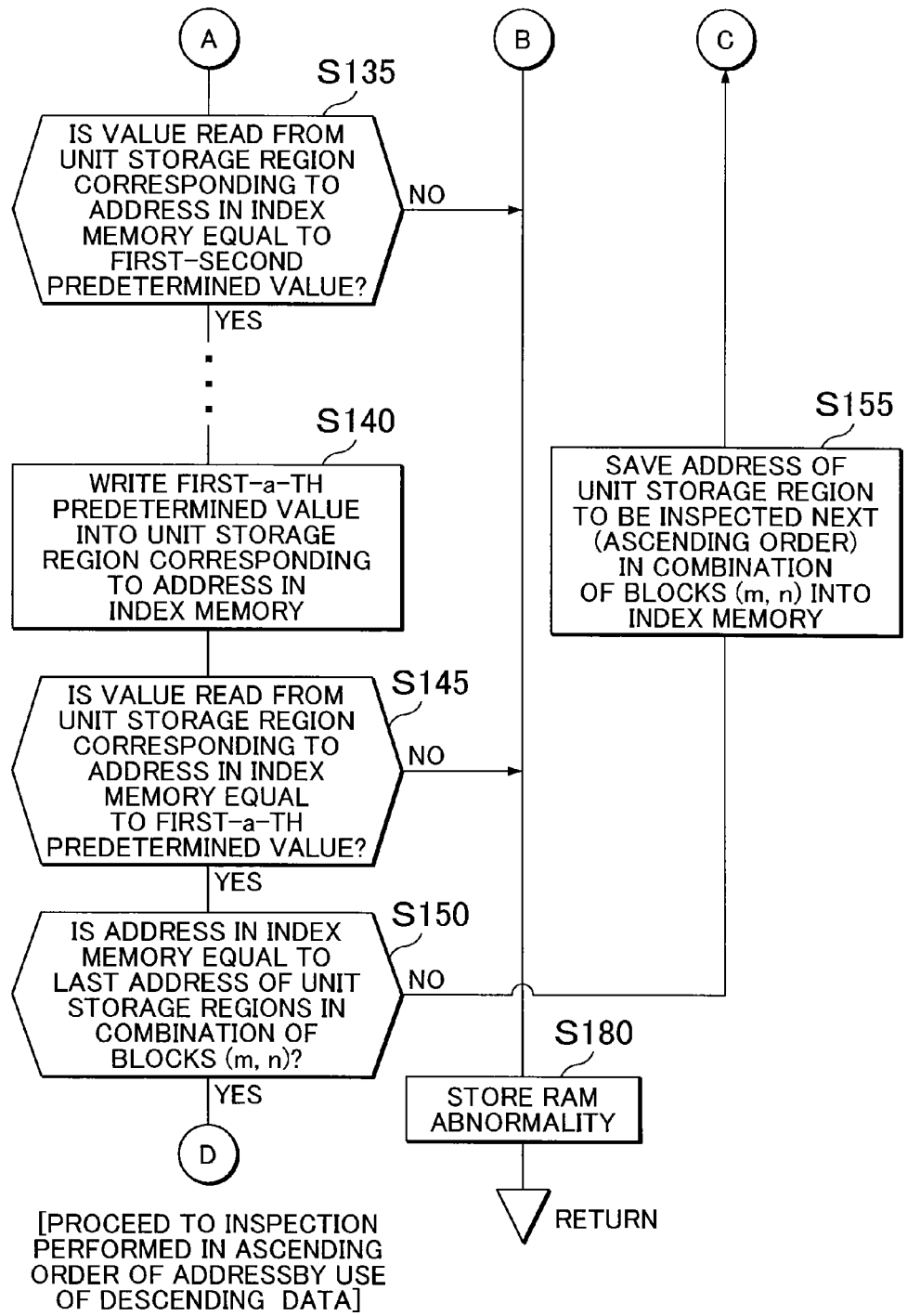

US 9,817,384 B2

METHOD OF INSPECTING RAM OF PROGRAMMABLE LOGIC CONTROLLER, AND PROGRAMMABLE LOGIC CONTROLLER

INCORPORATION BY REFERENCE

The disclosure of Japanese Patent Application No. 2014-061861 filed on Mar. 25, 2014 including the specification, drawings and abstract, is incorporated herein by reference in its entirety.

BACKGROUND OF THE INVENTION

1. Field of the Invention

The present invention relates to a method of inspecting a RAM of a programmable logic controller, and to a programmable logic controller.

2. Description of the Related Art

A programmable logic controller (hereinafter referred to as "PLC") is used to control automated machinery in a factory or the like. The PLC includes a central processing unit (hereinafter referred to as "CPU") that is a small computer and that executes a program. A ladder diagram that simulates a ladder circuit is used to prepare the program. The ladder diagram may be rewritten as appropriate into a sequence program that matches the usage. The PLC receives a signal (on or off information) about a continuity state input from a variety of input devices (such as switches and sensors). The PLC controls (e.g. outputs an on or off signal to) output devices (such as relays and motors) with the sequence program in which the variety of input devices are combined in a desired form (connected in series or in parallel).

It is necessary that the PLC used in a factory or the like should meet a predetermined safety standard (e.g. the IEC standard). Among such safety standards, there is provided a safety standard for a random access memory (that is abbreviated as "RAM" and that is a memory that enables data to be read from and written into a desired address at any time) used by the CPU. A variety of methods have been considered to inspect the RAM in order to meet the safety standard for the RAM. For example, a method called Galpat may be used to inspect the RAM in order to meet the safety standard for the RAM. However, inspecting the RAM using the Galpat takes a significantly long time (e.g. about two to three hours), and it takes much time to detect an abnormality of the RAM, which is not preferable.

Japanese Patent Application Publication No. 8-87429 (JP 8-87429 A) describes a method of inspecting an application program storage region (ROM region) of a PLC for performing sequence control that is changed in accordance with the usage, in which a check sum (inspection reference value) obtained by totaling program codes in a region to be inspected is stored in the ROM in advance. To execute the inspection, it is determined whether or not a value obtained by totaling values read from the ROM as the region to be inspected coincides with the check sum stored in the ROM.

Japanese Patent Application Publication No. 2006-40122 (JP 2006-40122 A) describes an inspection method in which a RAM region of a PLC to be inspected is divided into a plurality of regions, one inspection unit is inspected each time the PLC is turned on, and an inspection unit that is next to the inspection unit inspected before the PLC is turned off the last time is inspected when the PLC is turned on again after the PLC is turned off.

The inspection method described in JP 8-87429 A is intended to inspect program codes stored in the ROM, not to inspect the RAM, which enables values to be rewritten at any time, and may not be applied to the inspection of the RAM.

In the inspection method described in JP 2006-40122 A, the entire RAM region to be inspected is not inspected at a time when the PLC is turned on, but the inspection is performed little by little each time the PLC is turned on until the entire RAM region is completely inspected when the PLC is turned on the N-th time. Thus, it takes much time to detect an abnormality of the RAM since the occurrence of the abnormality, which is not preferable.

SUMMARY OF THE INVENTION

It is an object of the present invention to provide a method of inspecting a RAM of a programmable logic controller that enables all unit storage regions in a RAM inspection region to be inspected in about several minutes and that appropriately meets a predetermined safety standard, and a programmable logic controller.

According to an aspect of the present invention, a method of inspecting a RAM of a programmable logic controller, including:
(a) dividing a RAM inspection region, which is a region of the RAM to be inspected, into a plurality of blocks; and
(b) by using a control device, writing a predetermined value into unit storage regions in a combination of blocks obtained by combining two blocks extracted from the divided blocks and thereafter sequentially inspecting whether or not values read from the unit storage regions each coincide with the written value. In the method, the control device executes step (b) for all combinations of two blocks extracted from the divided blocks.

According to above mentioned aspect, step (b) is executed for all combinations of two blocks extracted from the blocks obtained by dividing the RAM inspection region, and thus it is possible to inspect the RAM in a short time and to appropriately meet a predetermined safety standard (such as the IEC standard).

BRIEF DESCRIPTION OF THE DRAWINGS

The foregoing and further features and advantages of the invention will become apparent from the following description of example embodiments with reference to the accompanying drawings, wherein like numerals are used to represent like elements and wherein:

FIG. 2 illustrates an example of the block configuration and the connection of the PLC composed of the control unit, the input unit, and the output unit;

FIG. 3 is a flowchart illustrating the procedure of a process for inspecting a RAM performed by a CPU of the PLC;

FIG. 4A is a flowchart illustrating the details of a process of a RAM writing/reading sub routine (SB 100) in the flowchart of FIG. 3;

FIG. 4B is a continuation of the flowchart of FIG. 4A;

DETAILED DESCRIPTION OF EMBODIMENTS

Figure 1:
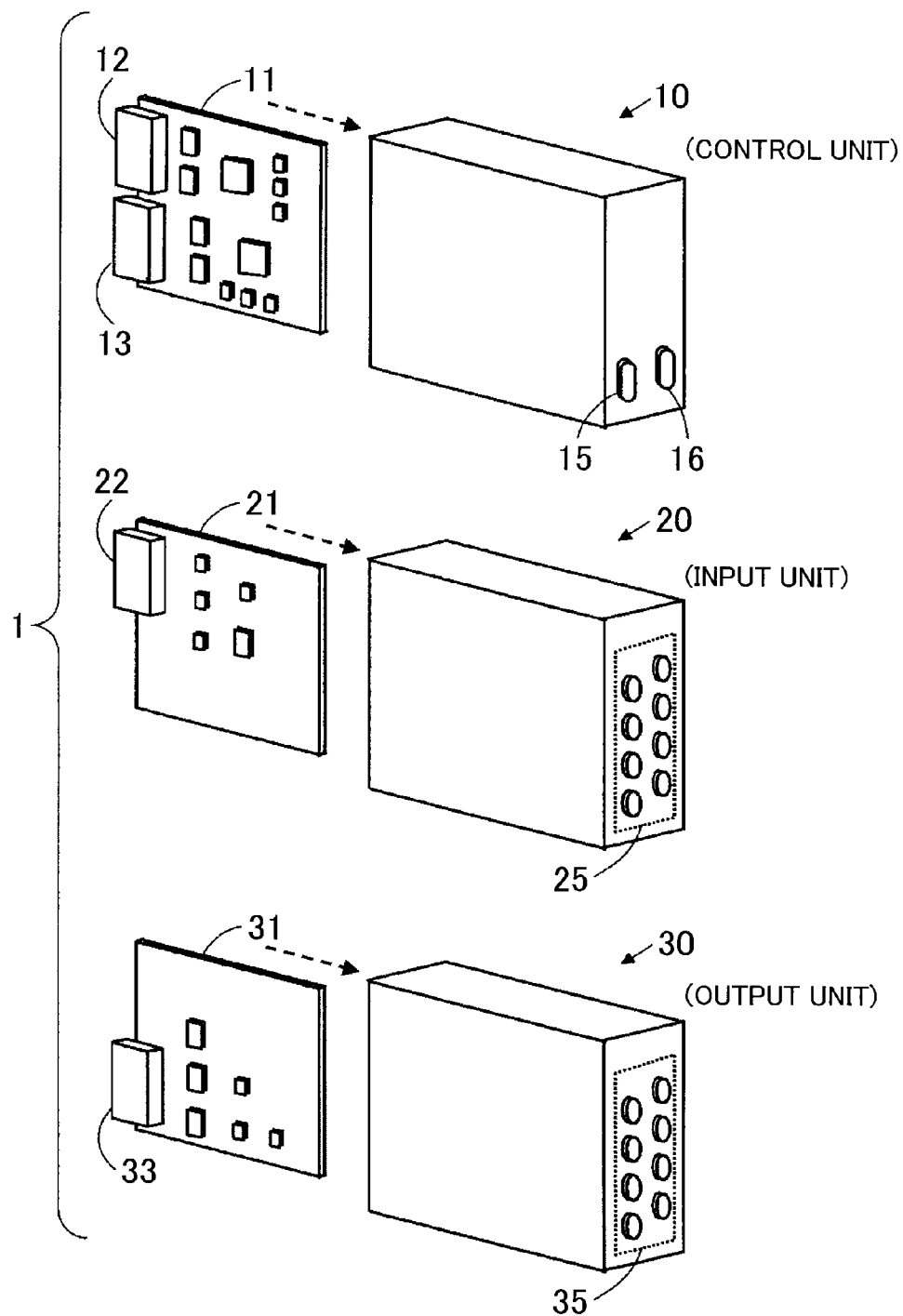
FIG. 1 is a perspective view illustrating an example of the appearance of a control unit, an input unit, and an output unit that compose a PLC according to the present invention.

An embodiment of the present invention will be described below with reference to the drawings. As illustrated in FIG. 1, a PLC 1 is composed of a control unit 10, an input unit 20, and an output unit 30. Extra input units 20 and output units 30 may be added as appropriate in accordance with the number of inputs and outputs. An input board 21 that includes a connector 22 for connection with the control unit 10 is housed in the input unit 20. The input unit 20 is provided with an input terminal 25 for connection with wiring that extends from a plurality of input devices (such as switches and sensors). An output board 31 that includes a connector 33 for connection with the control unit 10 is housed in the output unit 30. The output unit 30 is provided with an output terminal 35 for connection with wiring that extends to a plurality of output devices (such as relays and motors). A control board 11 that includes a connector 12 for connection with the input unit 20 and a connector 13 for connection with the output unit 30 is housed in the control unit 10. The control unit 10 is provided with a connector 15 for connection with a terminal device such as a personal computer, a connector 16 for connection with another PLC, and so forth.

Next, an example of the block configuration and the connection of the PLC 1 will be described with reference to FIG. 2. Wiring that extends from a plurality of input devices (such as a switch 40a, a sensor 40b through an input device 40n) is connected to the input terminal 25 of the input unit 20. A signal (such as on or off information) about a continuity state of the input devices is input to the input terminal 25. The input signal about the continuity state is transferred to the control unit 10 via an interface 21a (the term "interface" is hereinafter referred to as "I/F") and the connector 22.

The control unit 10 is mainly composed of a CPU 11a (corresponding to the control device), and includes a RAM 11b and a ROM 11c. A rewritable ROM such as an EEPROM or a flash ROM is used as the ROM 11c. The ROM 11c stores a sequence program that simulates a sequence circuit constituted by connecting desired input devices in series or in parallel, and so forth. A user can use the terminal device 50 to prepare a sequence program using a ladder circuit or the like, and can have the prepared sequence program stored in (written into) the control unit 10. A RAM inspection program that implements a RAM inspection method to be discussed later is implemented in the sequence program. The ROM 11c also stores a program for communication with the terminal device 50, another PLC 60, or the like via an I/F 11g, and so forth. The CPU 11a outputs a computation result based on the sequence program stored in the ROM 11c and the signal about the continuity state from the input devices input from the input unit 20 via the connector 12 and an I/F 11d to the output unit 30 via an I/F 11f and the connector 13.

Wiring that extends to a plurality of output devices (such as a motor 42a, a relay 42b through an output device 42n) is connected to the output terminal 35 of the output unit 30. A computation result obtained by the control unit 10 on the basis of the sequence program and the continuity state of the input devices is output to the output devices connected to the output terminal 35 via the connector 33 and an I/F 31a.

Next, the procedure of a process for inspecting the RAM 11b performed by the CPU 11a (corresponding to the control device) of the control unit 10 of the PLC 1 illustrated in FIG. 2 will be described with reference to FIG. 3. The RAM inspection illustrated in FIG. 3 is invoked by an interrupt process or the like while the control unit 10 is executing normal control, that is, a machine control process called a main process or a normal process. The timing to invoke the RAM inspection is not specifically limited. The process procedure of the RAM inspection method described in relation to the embodiment is based on a known memory testing method called "March C". In addition, the RAM inspection region is the entire region excluding special use regions such as a stack region, a communication region, and regions for peripheral devices.

Figure 8:
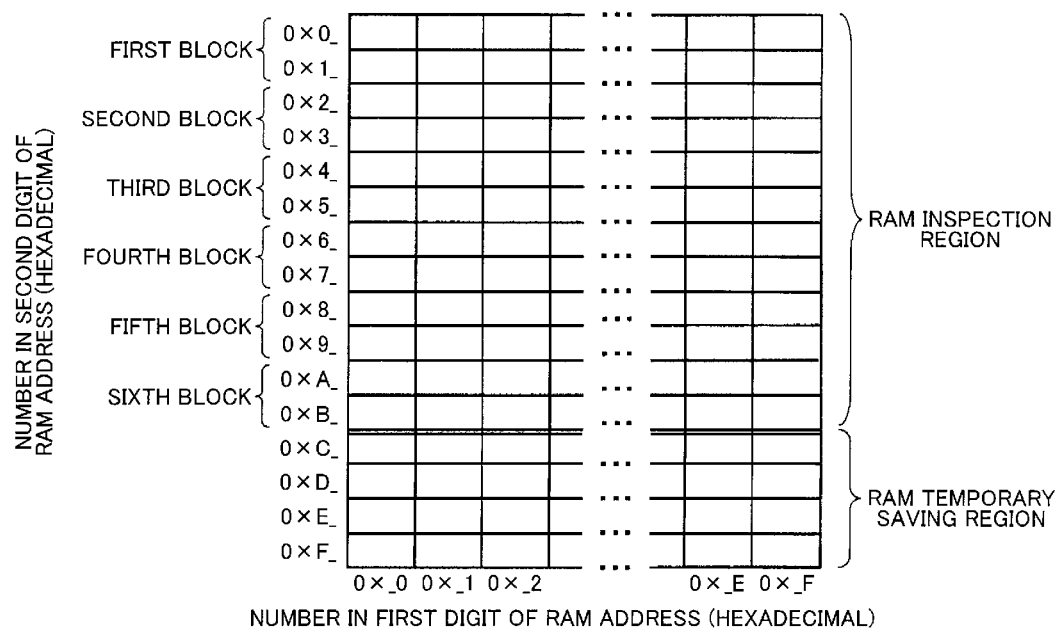
FIG. 8 illustrates an example of the configuration of a RAM region including a RAM inspection region to be inspected.

In step S10, the CPU 11a confirms a RAM inspection region as a region of the RAM to be inspected and a RAM temporary saving region, and the process proceeds to step S15. The start address and last address of the RAM inspection region, the start address and last address of the RAM temporary saving region, and so forth are stored in advance somewhere in the program region of the ROM 11c. In the example illustrated in FIG. 8, for example, the RAM inspection region is located at addresses 0x00 to 0xBF, and the RAM temporary saving region is located at addresses 0xC0 to 0xFF. (A number starting with "0x" represents hexadecimal.) The start and last addresses of such regions are stored in the ROM 11c, and the CPU 11a reads such addresses from the ROM 11c to confirm the RAM inspection region and the RAM temporary saving region. In addition, for the values in the RAM inspection region, it is necessary that the value stored before execution of the RAM inspection program should be maintained (held) also after execution of the RAM inspection program. The RAM temporary saving region may be a stack region, for example. In the example of FIG. 8, the RAM inspection region is a region at continuous addresses. However, the RAM inspection region is not limited to a region at continuous addresses, and may be a plurality of non-continuous regions.

In step S15, the CPU 11a divides the RAM inspection region into a plurality of blocks, and the process proceeds to step S20. The RAM inspection region is divided into blocks such that the number of unit storage regions in each block is equal to or less than half the number of unit storage regions in the RAM temporary saving region. The term "unit storage region" refers to a minimum storage region for writing and reading data, and may be a one-byte storage region, for example. Different addresses are assigned to each unit storage region. In the case of the example of the region configuration of the RAM of FIG. 8, the RAM temporary saving region has 64 unit storage regions located over addresses of 0xC0 to 0xFF (0x indicates a hexadecimal number), and thus the RAM inspection region is divided such that the number of unit storage regions in each block is equal to or less than 32 (=64*½). The inspection time can be made shorter as the number of divided blocks is smaller. Thus, in the example of FIG. 8, the RAM inspection region is divided such that the number of unit storage regions in each block is 32, and the RAM inspection region is divided into first to sixth blocks. The RAM inspection region may be divided into blocks in advance to omit steps S10 and S15.

In step S20, the CPU 11a extracts a combination of blocks (m, n) to be inspected first from combinations of blocks (such as a combination of the first block and the second block and a combination of the third block and the fourth block, for example) obtained by combining two blocks extracted from the divided blocks, and the process proceeds to step S35. For example, (m, n) is equal to (1, 2) in the case where a combination of the first block and the second block is extracted, and (m, n) is equal to (3, 4) in the case where a combination of the third block and the fourth block is extracted. For example, the combination of blocks to be inspected first may be a combination of blocks (1, 2). In the following description, (m, n) indicates a combination of the m-th block and the n-th block (m<n).

In step S35, the CPU 11a copies (saves) values of unit storage regions in the extracted combination of blocks (m, n) to respective unit storage regions in the RAM temporary saving region, and the process proceeds to step S40. In the case where (m, n) is equal to (1, 2), for example, values of unit storage regions (addresses 0x00 to 0x1F) in the first block illustrated in FIG. 8 are copied to respective unit storage regions (addresses 0xC0 to 0xDF) in the RAM temporary saving region, and values of unit storage regions (addresses 0x20 to 0x3F) in the second block are copied to respective unit storage regions (addresses 0xE0 to 0xFF) in the RAM temporary saving region.

In step S40, the CPU 11a executes a process of a sub routine SB 100 illustrated in FIGS. 4 to 7. Returning from the sub routine SB 100, the process proceeds to step S50. In the sub routine SB 100, as discussed later, a predetermined value is written into each unit storage region in the extracted combination of blocks (m, n), and thereafter it is sequentially inspected whether or not a value read from the unit storage region coincides with the written value. The process of the sub routine SB 100 corresponds to step (b) (the writing/reading step), and will be discussed in detail later.

In step S50, the CPU 11a determines whether or not the RAM is normal as a result of the process of the sub routine SB 100. In the case where the RAM is normal (Yes), the process proceeds to step S60. In the case where the RAM is not normal (No), the process proceeds to step S80. In step S80, the CPU 11a indicates (e.g. turns on an abnormality lamp) that an abnormality of the RAM has been found, and stops operation.

In the case where the process proceeds to step S60, the CPU 11a writes the copied values in the unit storage regions in the RAM temporary saving region (the value copied in step S35) back into the original unit storage regions in the extracted combination of blocks (m, n), and the process proceeds to step S65. In the case where (m, n) is equal to (1, 2), for example, the copied (saved) values in the unit storage regions (addresses 0xC0 to 0xDF) in the RAM temporary saving region illustrated in FIG. 8 are written back into the original unit storage regions (addresses 0x00 to 0x1F) in the first block, and the copied (saved) values in the unit storage regions (addresses 0xE0 to 0xFF) in the RAM temporary saving region are written back into the original unit storage regions (addresses 0x20 to 0x3F) in the second block. Consequently, the values held before the RAM inspection can be maintained (held) also after the RAM inspection.

In step S65, the CPU 11a determines whether or not inspection of all the combinations of blocks (m, n) has been finished. In the case where inspection of all the combinations of blocks has been finished (Yes), the process of the RAM inspection is ended. In the case where inspection of all the combinations of blocks has not been finished (No), the process proceeds to step S70. For example, in the case where the RAM inspection region is divided into first to sixth blocks as illustrated in FIG. 8, the process of the RAM inspection is ended when inspection of all the 15 (=$_6C_2$) combinations of blocks has been finished: (1, 2), (1, 3), (1, 4), (1, 5), (1, 6), (2, 3), (2, 4), (2, 5), (2, 6), (3, 4), (3, 5), (3, 6), (4, 5), (4, 6), and (5, 6).

In the case where the process proceeds to step S70, the CPU 11a extracts a combination of blocks (m, n) to be inspected next, and the process returns to step S35. For example, in the case where step S70 is reached when the combination of blocks (1, 2) has been inspected, the next combination of blocks (1, 3) is extracted, and the process returns to step S35.

Figure 5A:
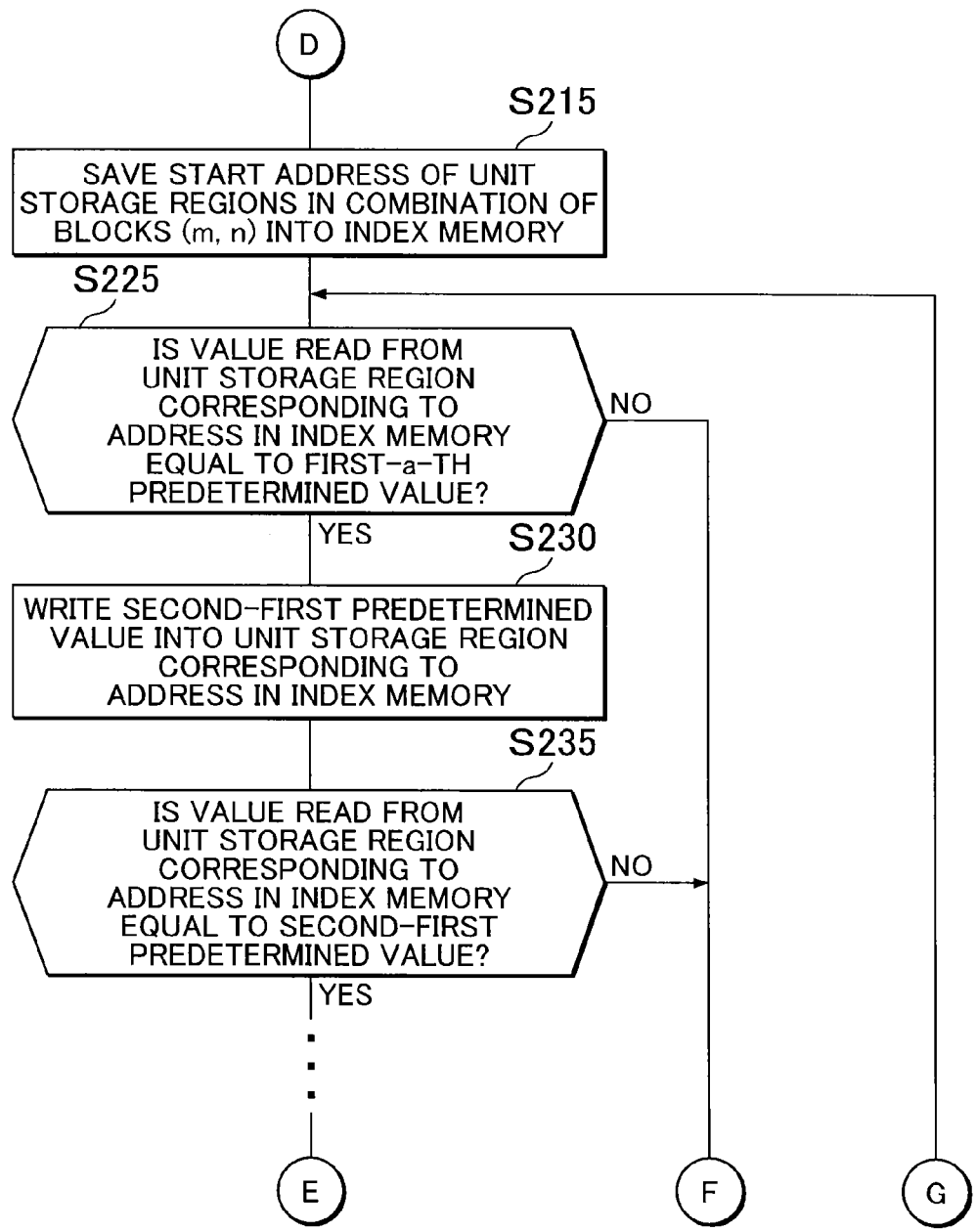
FIG. 5A is a flowchart that follows the flowchart of FIG. 4A and FIG. 4B.
Figure 5B:
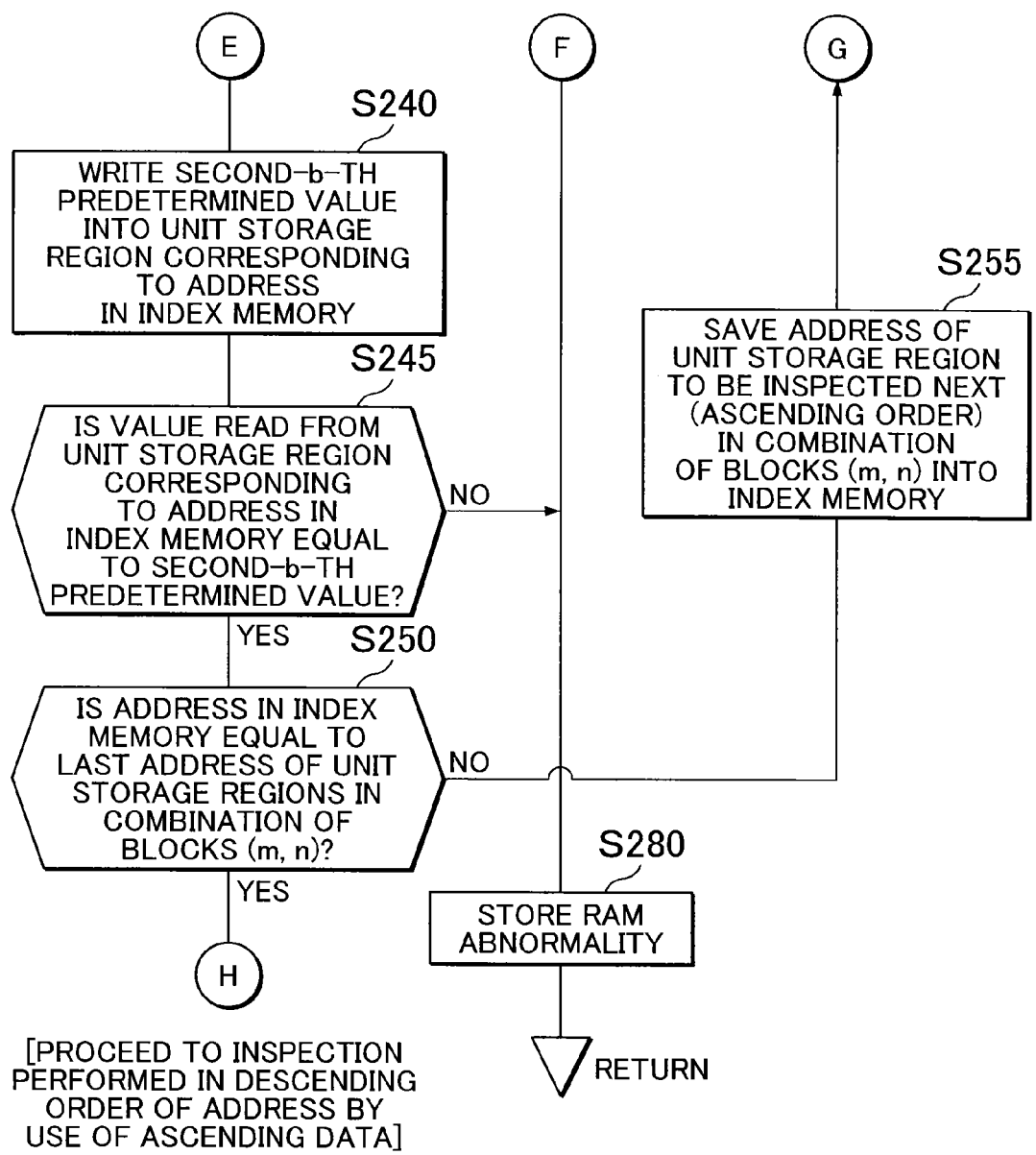
FIG. 5B is a continuation of the flowchart of FIG. 5A.
Figure 6A:
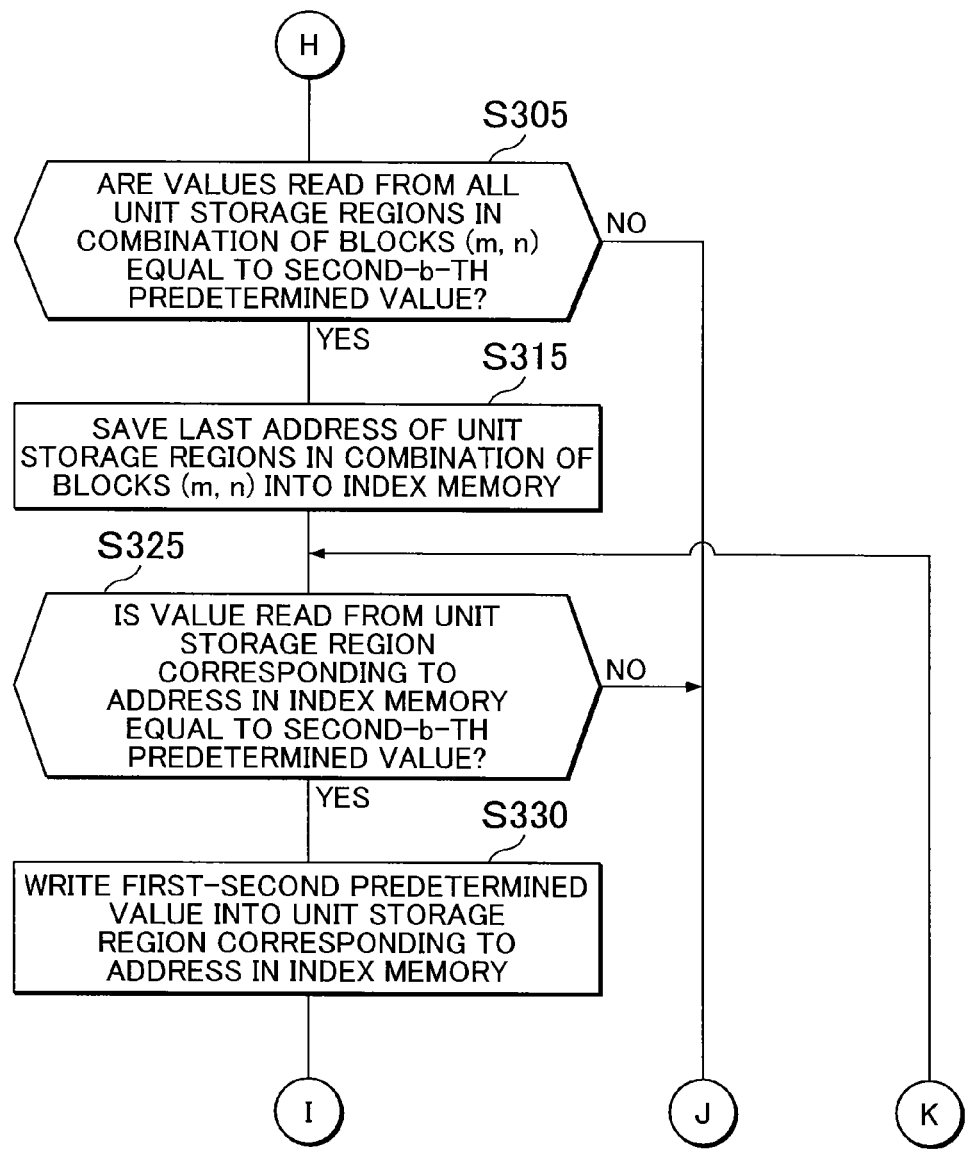
FIG. 6A is a flowchart that follows the flowchart of FIG. 5A and FIG. 5B.
Figure 6B:
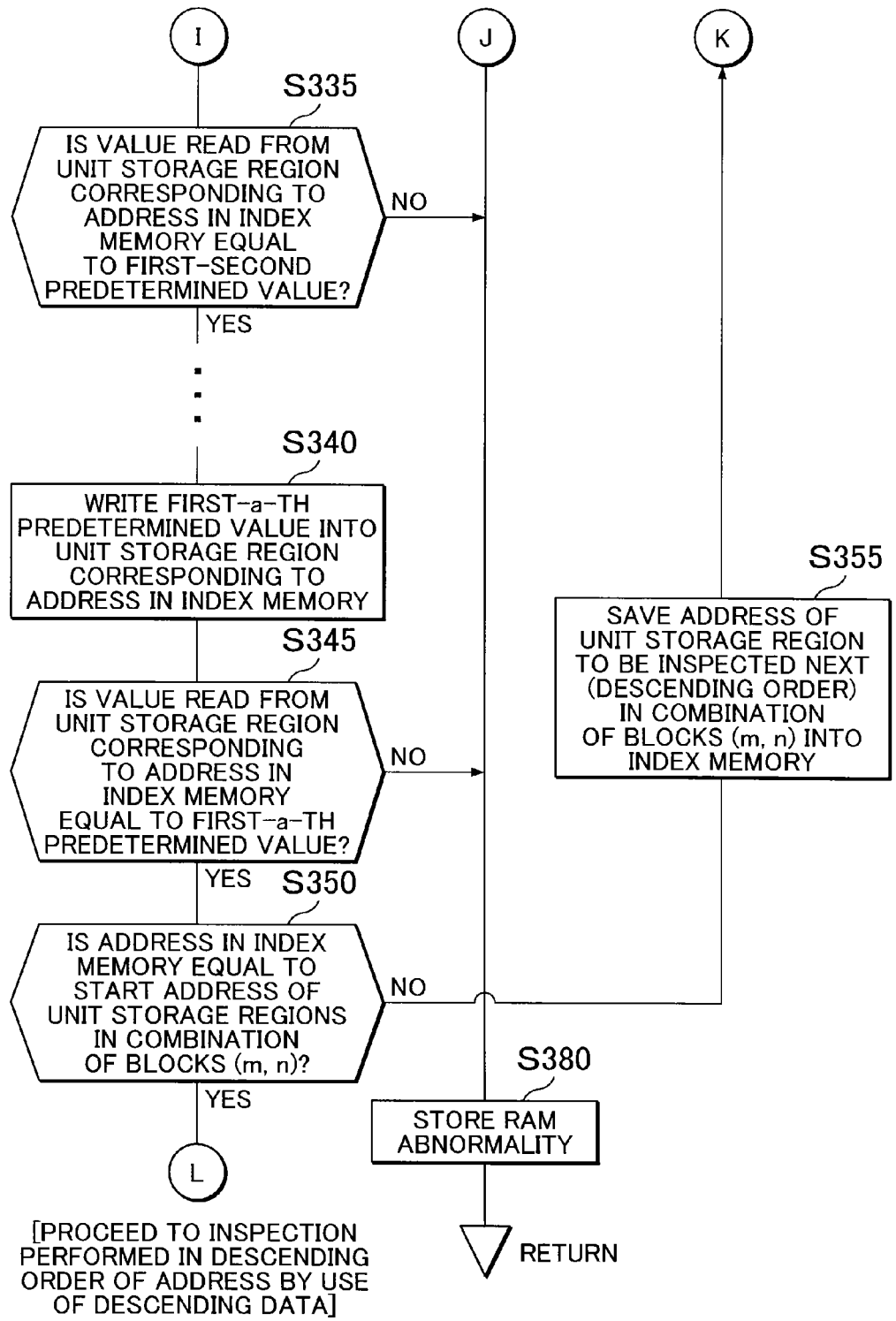
FIG. 6B is a continuation of the flowchart of FIG. 6A.
Figure 7A:
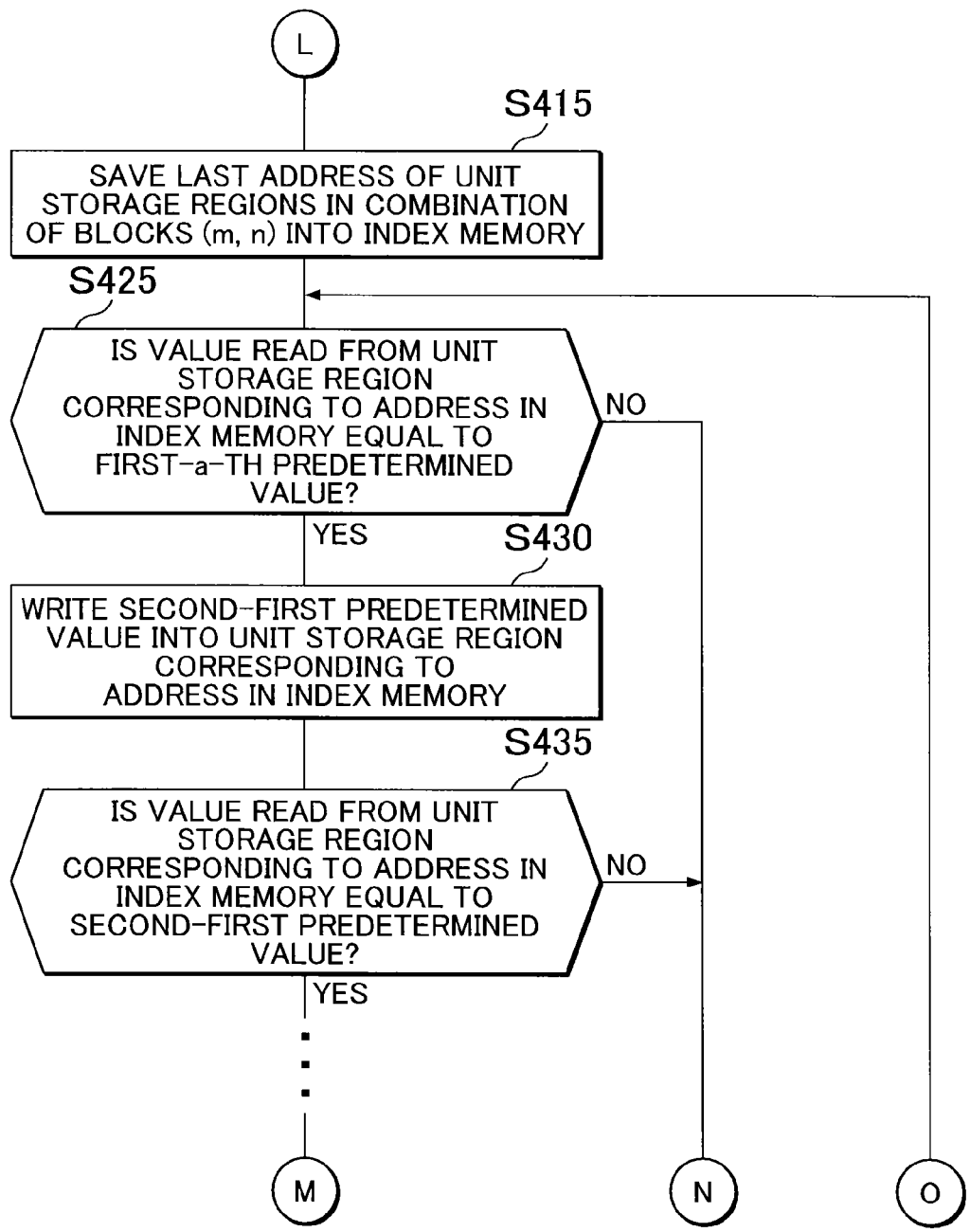
FIG. 7A is a flowchart that follows the flowchart of FIG. 6A and FIG. 6B.
Figure 7B:
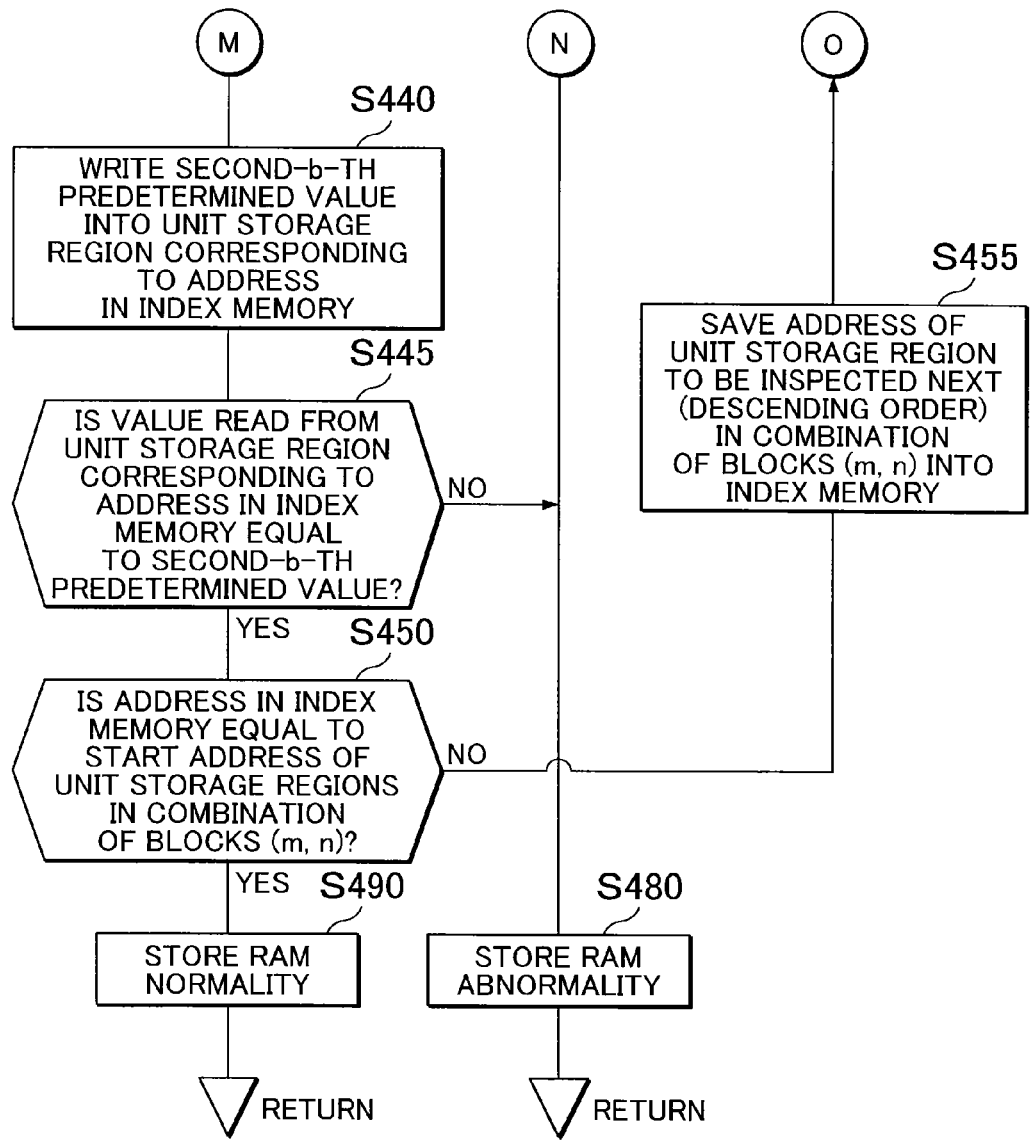
FIG. 7B is a continuation of the flowchart of FIG. 7A.

Next, the procedure of a process in the sub routine SB 100 executed in step S40 illustrated in FIG. 3 will be described with reference to FIGS. 4 to 7. The process procedure illustrated in FIG. 4 is a RAM writing/reading inspection executed in the ascending order of the address of the unit storage regions by use of ascending data (values) to be written and read. The process procedure illustrated in FIG. 5 is a RAM writing/reading inspection executed in the ascending order of the address of the unit storage regions by use of descending data (values) to be written and read. The process procedure illustrated in FIG. 6 is a RAM writing/reading inspection executed in the descending order of the address of the unit storage regions by use of ascending data (values) to be written and read. The process procedure illustrated in FIG. 7 is a RAM writing/reading inspection executed in the descending order of the address of the unit storage regions by use of descending data (values) to be written and read.

In step S110 illustrated in FIG. 4, the CPU 11a writes a first-first predetermined value into all the unit storage regions in the combination of blocks (m, n) in the ascending order of the address, and the process proceeds to step S115. In the case of the combination of blocks (1, 2), for example, 0x00 as the first-first predetermined value is first written into the unit storage region at the address 0x00, and 0x00 (first-first predetermined value) is written into the unit storage region at the address 0x01 which is the next in the ascending order. After that, 0x00 (first-first predetermined value) is sequentially written into the unit storage regions at addresses of up to 0x3F.

In step S115, the CPU 11a saves the start address of the unit storage regions in the combination of blocks (m, n) (in this case, the start address of the unit storage regions is 0x00) into an index value storage region (hereinafter referred to as "index memory"), and the process proceeds to step S125. In step S125, the CPU 11a reads a value from the unit storage region corresponding to the address in the index memory, and determines whether or not the read value coincides with the first-first predetermined value (the value written in step S110). In the case where such values coincide with each other (Yes), the process proceeds to step S130. In the case where such values do not coincide with each other (No), the process proceeds to step S180. In the case where the process proceeds to step S180, an abnormality of the RAM has been found, and the CPU 11a stores a RAM abnormality, and the process returns from the sub routine SB 100.

In the case where the process proceeds to step S130, the CPU 11a writes a first-second predetermined value which is the next in ascending order into the unit storage region corresponding to the address in the index memory, and the process proceeds to step S135. The first-second predetermined value may be 0x01, for example. In step S135, the CPU 11a reads a value from the unit storage region corresponding to the address in the index memory, and determines whether or not the read value coincides with the first-second predetermined value (the value written in step S130). In the case where such values coincide with each other (Yes), the process proceeds to step S140. In the case where such values do not coincide with each other (No), the process proceeds to step S180. In the case where the process proceeds to step S180, as discussed above, the CPU 11a stores a RAM abnormality, and the process returns from the sub routine SB 100. In FIG. 4, the following plural steps are not illustrated between steps S135 and S140. That is, as in steps S130 and S135, steps in which a predetermined value is written into the unit storage region corresponding to the address in the index memory and it is checked whether or not the read value is the predetermined value using ascending data, namely, a first-third predetermined value (e.g. 0x03), a first-fourth predetermined value (e.g. 0x07), a first-fifth predetermined value (e.g. 0x0F), a first-sixth predetermined value (e.g. 0x1F), a first-seventh predetermined value (e.g. 0x3F), and a first-eighth predetermined value (e.g. 0x7F).

In the case where the process proceeds to step S140, the CPU 11a writes a first-a-th predetermined value (e.g. 0xFF) into the unit storage region corresponding to the address in the index memory, and the process proceeds to step S145. In step S145, the CPU 11a reads a value from the unit storage region corresponding to the address in the index memory, and determines whether or not the read value coincides with the first-a-th predetermined value (the value written in step S140). In the case where such values coincide with each other (Yes), the process proceeds to step S150. In the case where such values do not coincide with each other (No), the process proceeds to step S180. In the case where the process proceeds to step S180, as discussed above, the CPU 11a stores a RAM abnormality, and the process returns from the sub routine SB 100.

In the case where the process proceeds to step S150, the CPU 11a determines whether or not the address in the index memory is the last address of the unit storage regions in the combination of blocks (m, n) that is currently checked. In the case where the address in the index memory is the last address of the unit storage regions (Yes), the process proceeds to the process of FIG. 5 which corresponds to symbol B. In the case where the address in the index memory is not the last address of the unit storage regions (No), the process proceeds to step S155. For example, in the case of the combination of blocks (1, 2) (the first block and the second block) illustrated in FIG. 8, the CPU 11a determines that the address in the index memory is the last address of the unit storage regions if the address in the index memory is 0x3F.

In the case where the process proceeds to step S155, the CPU 11a saves into the index memory the address of the unit storage region to be inspected next in the combination of blocks (m, n) that is currently extracted, and the process returns to step S125. For example, in the case where the combination of blocks (1, 2) is currently extracted and the unit storage region at 0x00 has been checked, 0x01 which is the address of the unit storage region to be inspected next is saved into the index memory since the inspection is performed in the ascending order of the address of the unit storage regions in the process of FIG. 4.

The RAM writing/reading inspection executed in the ascending order of the address of the unit storage regions by use of the ascending of data (values) to be written and read is completed through the process procedure illustrated in FIG. 4. Subsequently, the RAM writing/reading inspection executed in the ascending order of the address of the unit storage regions by use of the descending data (values) to be written and read is executed through the process procedure illustrated in FIG. 5.

When proceeding from step S150 to symbol B in the flowchart illustrated in FIG. 4, the process proceeds to the process illustrated in FIG. 5. The processes in steps S215 to S280 illustrated in FIG. 5 are the same as the processes illustrated in FIG. 4 in that the unit storage regions in the same combination of blocks (m, n) are checked in the ascending order of the address, but are different from such processes in that data to be written and read are descending data rather than ascending data.

The process in step S215 is the same as the process in step S115 of FIG. 4, and thus is not described. The process in step S225 is different from the process in step S125 of FIG. 4 in that the read value is the first-a-th predetermined value (which is the value written in step S140, e.g. 0xFF). In the case where the read value coincides with the first-a-th predetermined value (Yes), the process proceeds to step S230. In the case where the read value does not coincide with the first-a-th predetermined value, the process proceeds to step S280. In the case where the process proceeds to step S280, the CPU 11a stores a RAM abnormality, and the process returns from the sub routine SB 100.

The processes in steps S230 to S245 are different from the processes in steps S130 to S145 of FIG. 4 in that the values to be written and read are descending values rather than ascending values. That is, in steps S130 to S145 of FIG. 4, ascending data are written and read, namely in the order of the first-second predetermined value (0x01), the first-third predetermined value (0x03), the first-fourth predetermined value (0x07) through the first-a-th predetermined value (0xFF). In the processes in steps S230 to S245, however, descending data are written and read, namely in the order of a second-first predetermined value (e.g. 0xFE), a second-second predetermined value (e.g. 0xFC), a second-third predetermined value (e.g. 0xF8), a second-fourth predetermined value (e.g. 0xF0), a second-fifth predetermined value (e.g. 0xE0), a second-sixth predetermined value (e.g. 0xC0), a second-seventh predetermined value (e.g. 0x80), and a second-b-th predetermined value (e.g. 0x00).

In the case where the process proceeds to step S250, as in the process in step S150 of FIG. 4, the CPU 11a determines whether or not the address in the index memory is the last address of the unit storage regions in the combination of blocks (m, n) that is currently checked. In the case where the address in the index memory is the last address of the unit storage regions (Yes), the process proceeds to the process of FIG. 6 indicated by symbol C. In the case where the address in the index memory is not the last address of the unit storage regions (No), the process proceeds to step S255.

In the case where the process proceeds to step S255, the CPU 11a saves into the index memory the address of the unit storage region to be inspected next in the combination of blocks (m, n) that is currently extracted, and the process returns to step S225. For example, in the case where the combination of blocks (1, 2) is currently extracted and the unit storage region at 0x00 has been checked, 0x01 which is the address of the unit storage region to be inspected next is saved into the index memory since the inspection is performed in the ascending order of the address of the unit storage regions in the process of FIG. 5.

The RAM writing/reading inspection executed in the ascending order of the address of the unit storage regions by use of the descending data (values) to be written and read is completed through the process procedure illustrated in FIG. 5. Subsequently, a RAM writing/reading inspection executed in the descending order of the address of the unit storage regions by use of the ascending data (values) to be written and read is executed through the process procedure illustrated in FIG. 6.

When proceeding from step S250 to symbol C in the flowchart illustrated in FIG. 5, the process proceeds to the process illustrated in FIG. 6. The processes in steps S305 to S380 illustrated in FIG. 6 are different from the processes illustrated in FIG. 4 in that the unit storage regions in the same combination of blocks (m, n) are checked in the descending order of the address, but are the same as such processes in that data to be written and read are ascending data.

In step S305, the CPU 11a sequentially reads values from all the unit storage regions in the combination of blocks (m, n) (e.g. reads values in the ascending order of the address of the unit storage regions), and determines whether or not the read values each coincide with the second-b-th predetermined value (0x00). In the case where such values coincide with each other (Yes), the process proceeds to step S315. In the case where such values do not coincide with each other (No), the process proceeds to step S380. In the case where the process proceeds to step S380, the CPU 11a stores a RAM abnormality, and the process returns from the sub routine SB 100.

In the case where the process proceeds to step S315, the CPU 11a saves into the index memory the last address of the unit storage regions in the combination of blocks (m, n) (in this case, the last address of the unit storage regions is 0x3F), and the process proceeds to step S325. In step S325, the CPU 11a reads a value from the unit storage region corresponding to the address in the index memory, and determines whether or not the read value coincides with the second-b-th predetermined value (the value written in step S240). In the case where such values coincide with each other (Yes), the process proceeds to step S330. In the case where such values do not coincide with each other (No), the process proceeds to step S380. In the case where the process proceeds to step S380, the CPU 11a stores a RAM abnormality, and the process returns from the sub routine SB 100.

The processes in steps S330 to S345 are the same as the processes in steps S130 to S145 in that the values to be written and read are ascending values, but are different from such processes in that the value in the index memory is varied in the descending order from the last address of the unit storage regions to the start address of the unit storage regions. Ascending data are written and read, namely in the order of the first-second predetermined value (0x01), the first-third predetermined value (0x03), the first-fourth predetermined value (0x07) through the first-a-th predetermined value (0xFF).

In the case where the process proceeds to step S350, the CPU 11a determines whether or not the address in the index memory is the start address of the unit storage regions in the combination of blocks (m, n) that is currently checked. In the case where the address in the index memory is the start address of the unit storage regions (Yes), the process proceeds to the process of FIG. 7 indicated by symbol D. In the case where the address in the index memory is not the start address of the unit storage regions (No), the process proceeds to step S355. In the case of the combination of blocks (1, 2) (the first block and the second block) illustrated in FIG. 8, the CPU 11a determines that the address in the index memory is the start address of the unit storage regions if the address in the index memory is 0x00.

In the case where the process proceeds to step S355, the CPU 11a saves into the index memory the address of the unit storage region to be inspected next in the combination of blocks (m, n) that is currently extracted, and the process returns to step S325. For example, in the case where the combination of blocks (1, 2) is currently extracted and the unit storage region at 0x3F has been checked, 0x3E which is the address of the unit storage region to be inspected next is saved into the index memory since the inspection is performed in the descending order of the address of the unit storage regions in the process of FIG. 6.

The RAM writing/reading inspection executed in the descending order of the address of the unit storage regions by use of the ascending data (values) to be written and read is completed through the process procedure illustrated in FIG. 6. Subsequently, the RAM writing/reading inspection executed in the descending order of the address of the unit storage regions by use of the descending data (values) to be written and read is executed through the process procedure illustrated in FIG. 7.

When proceeding from step S350 to symbol D in the flowchart illustrated in FIG. 6, the process proceeds to the process illustrated in FIG. 7. The processes in steps S415 to S490 illustrated in FIG. 7 are the same as the processes illustrated in FIG. 6 in that the unit storage regions in the same combination of blocks (m, n) are checked in the descending order of the address, but are different from such processes in that data to be written and read are descending data rather than ascending data.

The process in step S415 is the same as the process in step S315 of FIG. 6, and thus is not described. The process in step S425 is different from the process in step S325 of FIG. 6 in that the read value is the first-a-th predetermined value (which is the value written in step S340, e.g. 0xFF). In the case where the read value coincides with the first-a-th predetermined value (Yes), the process proceeds to step S430. In the case where the read value does not coincide with the first-a-th predetermined value, the process proceeds to step S480. In the case where the process proceeds to step S480, the CPU 11a stores a RAM abnormality, and the process returns from the sub routine SB 100.

The processes in steps S430 to S445 are different from the processes in steps S330 to S345 of FIG. 6 in that the values to be written and read are descending values rather than ascending values. In steps S330 to S345 of FIG. 6, ascending data are written and read, namely in the order of the first-second predetermined value (0x01), the first-third predetermined value (0x03), the first-fourth predetermined value (0x07) through the first-a-th predetermined value (0xFF). In the processes in steps S430 to S445, however, descending data are written and read, namely in the order of the second-first predetermined value (e.g. 0xFE), the second-second predetermined value (e.g. 0xFC), the second-third predetermined value (e.g. 0xF8), the second-fourth predetermined value (e.g. 0xF0), the second-fifth predetermined value (e.g. 0xE0), the second-sixth predetermined value (e.g. 0xC0), the second-seventh predetermined value (e.g. 0x80), and the second-b-th predetermined value (e.g. 0x00).

In the case where the process proceeds to step S450, as in the process in step S350 of FIG. 6, the CPU 11a determines whether or not the address in the index memory is the start address of the unit storage regions in the combination of blocks (m, n) that is currently checked. In the case where the address in the index memory is the start address of the unit storage regions (Yes), the CPU 11a proceeds to step S490. In the case where the address in the index memory is not the start address of the unit storage regions (No), the process proceeds to step S455.

In the case where the process proceeds to step S455, the CPU 11a saves into the index memory the address of the unit storage region to be inspected next in the combination of blocks (m, n) that is currently extracted, and the process returns to step S425. For example, in the case where the combination of blocks (1, 2) is currently extracted and the unit storage region at 0x3F has been checked, 0x3E which is the address of the unit storage region to be inspected next is saved into the index memory since the inspection is performed in the descending order of the address of the unit storage regions in the process of FIG. 7.

The RAM writing/reading inspection executed in the descending order of the address of the unit storage regions by use of the descending data (values) to be written and read is completed through the process procedure illustrated in FIG. 7. In the case where the process proceeds to step S490, it has been confirmed that the RAM is normal for all the unit storage regions in the extracted combination of blocks (m, n) in all of the RAM inspection performed in the ascending order of the address by use of the ascending data illustrated in FIG. 4, the RAM inspection performed in the ascending order of the address by use of descending data illustrated in FIG. 5, the RAM inspection performed in the descending order of the address by use of the ascending data illustrated in FIG. 6, and the RAM inspection performed in the descending order of the address by use of the descending data illustrated in FIG. 7. Thus, the CPU 11a stores a RAM normality, and the process returns from the sub routine SB 100.

By the RAM inspection method described above, in the case where the RAM inspection region is divided into three blocks, namely a first block, a second block, and a third block, for example, it can be confirmed that there is no RAM interference among the first block, the second block, and the third block, by confirming that there is no RAM interference for combinations of blocks (1, 2), (1, 3), and (2, 3). The term "RAM interference" refers to a phenomenon in which when data in a unit storage region at a first address are rewritten, data in a unit storage region at a second address that is different from the first address are also changed. According to the RAM inspection method described in relation to the embodiment, it is possible to appropriately inspect whether unit storage regions in the entire RAM inspection region are normal in a short time and to meet a predetermined safety standard by dividing the RAM inspection region into a plurality of blocks, for example, and inspecting all combinations of two blocks even in the case where the size of the RAM inspection region is so large that there is no RAM temporary saving region that is sized enough to temporarily save the values of all the unit storage regions in the RAM inspection region.

What is claimed is:

1. A method of inspecting a RAM of a programmable logic controller, comprising:
   (a) dividing a RAM inspection region, which is a region of the RAM, into at least three blocks; and
   (b) by using a control device, writing a predetermined value into unit storage regions in a combination of two blocks of the at least three blocks and thereafter sequentially inspecting whether or not values read from the unit storage regions in the combination each coincide with the written predetermined value, wherein
   step (b) is executed separately for:
      the combination of two blocks including a first block and a second block of the at least three blocks,
      the combination of two blocks including the first block and a third block of the at least three blocks, and
      the combination of two blocks including the second block and the third block of the at least three blocks.

2. The method of inspecting a RAM of a programmable logic controller according to claim 1, wherein:
   the RAM is provided with a RAM temporary saving region which is different from the RAM inspection region;
   the number of unit storage regions in each block of the at least three blocks is set to be equal to or less than half a number of unit storage regions in the RAM temporary saving region; and
   the control device
      executes step (b) after values in the unit storage regions in the combination of two blocks are stored in the RAM temporary saving region, and
      writes the values stored in the RAM temporary saving region back into the respective unit storage regions in the combination of two blocks after execution of step (b) so that the values stored in the RAM inspection region before inspection of the RAM are reproduced and maintained after inspection of the RAM.

3. A programmable logic controller in which a RAM inspection program is installed, wherein, when executed, the RAM inspection program causes the method of inspecting the RAM of the programmable logic controller according to claim 1 to be performed.

4. A programmable logic controller in which a RAM inspection program is installed, wherein, when executed, the RAM inspection program causes the method of inspecting the RAM of the programmable logic controller according to claim 2 to be performed.

5. The method of inspecting a RAM of a programmable logic controller according to claim 1, wherein:
   dividing the RAM inspection region includes dividing the RAM inspection region into six blocks, and
   step (b) is executed separately for all fifteen combinations of two blocks of the six blocks.

6. The method of inspecting a RAM of a programmable logic controller according to claim 1, wherein, in step (b), the same predetermined value is written to all unit storage regions in the combination of two blocks.

7. The method of inspecting a RAM of a programmable logic controller according to claim 1 further comprising storing a RAM abnormality when the values read from the unit storage regions in the combination do not coincide with the written predetermined value.

8. The method of inspecting a RAM of a programmable logic controller according to claim 1, wherein the control device indicates the RAM abnormality using an abnormality lamp.

9. The method of inspecting a RAM of a programmable logic controller according to claim 1, wherein step (b) includes a plurality of distinct writing and reading inspection processes.

10. The method of inspecting a RAM of a programmable logic controller according to claim 9, wherein the plurality of distinct writing and reading inspection processes includes:
    an inspection performed in ascending order of addresses using ascending data,
    an inspection performed in ascending order of addresses using descending data,
    an inspection performed in descending order of addresses using ascending data, and an inspection performed in descending order of addresses using descending data.

* * * * *